(12) United States Patent
DiStefano et al.

(10) Patent No.: US 6,197,665 B1
(45) Date of Patent: Mar. 6, 2001

(54) LAMINATION MACHINE AND METHOD TO LAMINATE A COVERLAY TO A MICROELECTRONIC PACKAGE

(75) Inventors: Thomas H. DiStefano, Monte Sereno; Craig S. Mitchell; Tan Nguyen, both of Santa Clara, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/292,640

(22) Filed: Apr. 15, 1999

Related U.S. Application Data (60) Provisional application No. 60/081,851, filed on Apr. 15, 1998.

(51) Int. Cl.[7] .................................................. H01L 21/36
(52) U.S. Cl. ........................ 438/502; 438/458; 156/285
(58) Field of Search ................................. 438/282, 458, 438/502, 113, 509, 530, 653; 347/50; 73/718, 724; 156/166, 244, 285

(56) References Cited

U.S. PATENT DOCUMENTS

| | | | |
|---|---|---|---|
| 5,090,246 | * 2/1992 | Colla et al. ............................. | 73/718 |
| 5,148,265 | 9/1992 | Khandros et al. ...................... | 357/80 |
| 5,148,266 | 9/1992 | Khandros et al. ...................... | 357/80 |
| 5,227,812 | * 7/1993 | Watanabe et al. ..................... | 347/50 |
| 5,282,312 | 2/1994 | DiStefano et al. ..................... | 29/830 |
| 5,398,863 | 3/1995 | Grube et al. .......................... | 228/106 |

* cited by examiner

*Primary Examiner*—David Nelms
*Assistant Examiner*—Phuc T. Dang
(74) *Attorney, Agent, or Firm*—Lerner, David, Littenberg, Krumholz & Mentlik, LLP

(57) ABSTRACT

A lamination machine includes means for using gas pressure to bring a coverlay and a microelectronic package into intimate contact and means for heating a coverlay adhesive in order to seal the coverlay to the package. A method of laminating a coverlay to a microelectronic package using the lamination machine includes using gas pressure to bring a coverlay into intimate contact with a microelectronic package. The method also includes heating an adhesive on the coverlay in order to adhere the coverlay to the package. Once the coverlay is laminated to the package, the package can be encapsulated with a curable encapsulant composition. The method may also include decreasing the pressure in the chamber disposed above the package to reduce voids and bubble and/or regulating the pressure in a bladder disposed in a chamber below the package. The lamination machine may also include a pressurized bladder which is used to support the microelectronic package and minimize stress on the leads during the lamination process.

50 Claims, 6 Drawing Sheets

LAMINATION MACHINE AND METHOD TO LAMINATE A COVERLAY TO A MICROELECTRONIC PACKAGE

CROSS REFERENCE TO RELATED APPLICATIONS

The present application claims benefit of United States Provisional Patent Application with Ser. No. 60/081,851, filed on Apr. 15, 1998, the disclosure of which is hereby incorporated by reference herein.

FIELD OF THE INVENTION

The present invention relates to lamination machines and to methods of laminating a coverlay to a microelectronic package.

BACKGROUND OF THE INVENTION

Some microelectronic packages such as those described in commonly assigned U.S. Pat. No. 5,148,265 and 5,148,266, the specifications of which are incorporated by reference herein, may be manufactured by bonding and electrically connecting a plurality of semiconductor chips to a dielectric layer having electrically conductive terminals. In order to protect such microelectronic packages, it is often desirable to encapsulate the microelectronic packages using a polymer, such as an epoxy resin or a silicone elastomer. Such encapsulants are frequently supplied as liquid compositions that must be cured to a solid form. In order to contain the liquid encapsulant composition within the microelectronic package it is sometimes necessary or desirable to laminate a coverlay to the package. The coverlay lamination process seals the package for subsequent encapsulation. One such encapsulation process is describe in commonly assigned U.S. patent application Ser. No. 08/726,697 which was filed on Oct. 7, 1996, the specification of which is incorporated herein by reference.

It is often desirable to laminate a coverlay having a plurality of apertures to the bottom surface of the package so that the terminals are exposed for subsequent connection to an external circuit. The apertures in the coverlay should be aligned with the terminals on the bottom surface of the dielectric layer so that the coverlay seals any holes or windows in the dielectric layer, while the apertures in the coverlay leave the terminals exposed for subsequent attachment of solder balls. With the holes and windows in the dielectric layer covered with the coverlay, the microelectronic package can be encapsulated. Typically this is done with a curable liquid encapsulant composition. The coverlay may then be removed or it may be allowed to remain permanently attached to the microelectronic package.

In order to properly encapsulate the microelectronic package, the bond between the coverlay and the microelectronic package should be void free. Voids can create a number of problems, including solder land contamination, coverlay delamination and poor package aesthetics. If the boundary between the coverlay and the top surface of the microelectronic package contains bubbles or voids, the liquid encapsulant composition can seep through the holes and windows in the dielectric layer and contaminate the solder lands on the surface of the microelectronic package. Delamination is also more likely to start and propagate at voids because the bond between the coverlay and the package at such voids is weak. Voids are also unsightly and may cause a user to question the reliability of the package.

Prior art lamination machines used vacuum, followed by high lamination forces applied directly to the microelectronic package to laminate a coverlay to a microelectronic package. Such machines were used by placing a microelectronic package and coverlay into a vacuum bag. A vacuum was pulled in the bag and then the outside of the vacuum bag was exposed to an elevated pressure. The high forces tended to damage leads in the microelectronic packages. For instance, high lamination forces tend to flatten and kink "S-shaped" leads, leading to a less reliable lead and therefor a less reliable package. Examples of such "S-shaped" leads in microelectronic packaging are described in commonly assigned U.S. Pat. No. 5,398,863, the disclosure of which is incorporated by reference herein.

SUMMARY OF THE INVENTION

The present invention relates to lamination machines and methods of laminating microelectronic packages using such machines. In one method and associated apparatus of the present invention, the lamination machine uses gas pressure to bring a coverlay and a microelectronic package into intimate contact and a heated platen to seal the coverlay to the package. The sealed package can then be encapsulated. In another method and associated apparatus of the present invention, a lamination machine with a pressurized bladder is used in combination with heat to laminate and seal a coverlay to a microelectronic package. The bladder supports the microelectronic package and minimizes stress on the leads during the lamination process.

DETAILED DESCRIPTION OF THE PREFERRED EMBODIMENTS

Terms such as "above, "beneath, "top", "bottom", and other terms description of directions are used in the present specification to describe the relative positions of elements described in FIGS. 1–4 to other elements described with reference to such figures. Such terms should not be taken to refer to any gravitational frame of reference.

Figure 1:
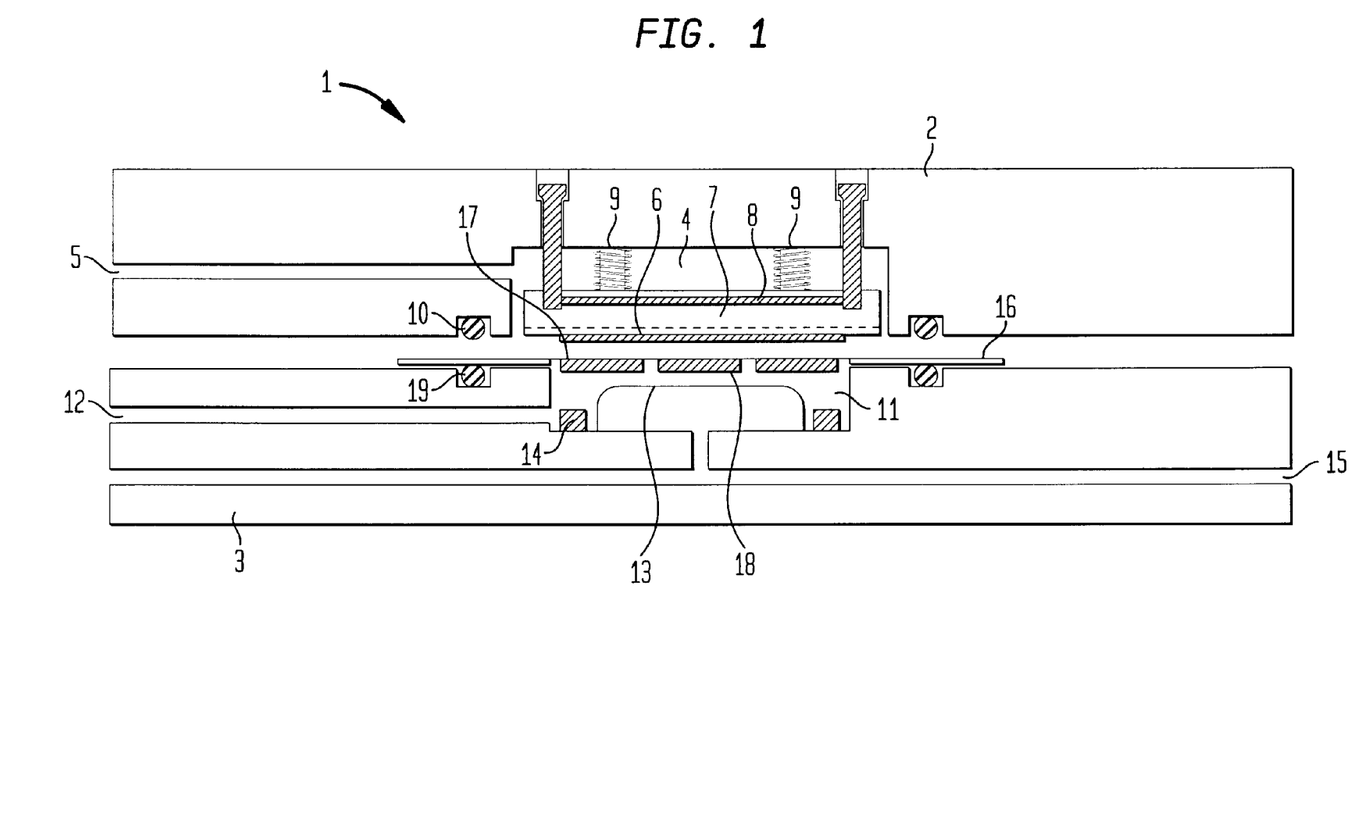
FIG. 1 is a side view of one embodiment of the lamination machine of the present invention.

In one method of the present invention, a lamination machine is used to laminate a coverlay to a microelectronic package by using gas pressure to bring the coverlay and microelectronic package into intimate contact and heating the coverlay adhesive to adhere the coverlay to the package. FIG. 1 is a side view of such a lamination machine. The lamination machine 1 has a top plate 2 and a bottom plate 3. Top plate 2 has a top recess 4 that is connected to top conduit 5. Top conduit 5 may be connected to a pump (not shown) which is capable of regulating the pressure in the top chamber that is formed when the top and bottom plates are forced together. When the coverlay to be laminated has apertures, the preferred lamination machine is capable of decreasing the pressure in the top chamber in order to minimize voids and bubbles. In preferred embodiments, the lamination machine also has a platen 6, which is connected to a heater block 7. Heater block 7 is connected to the top plate 2 via a pair of springs 9. Heater block 7 is also connected to heater 8.

Figure 4:
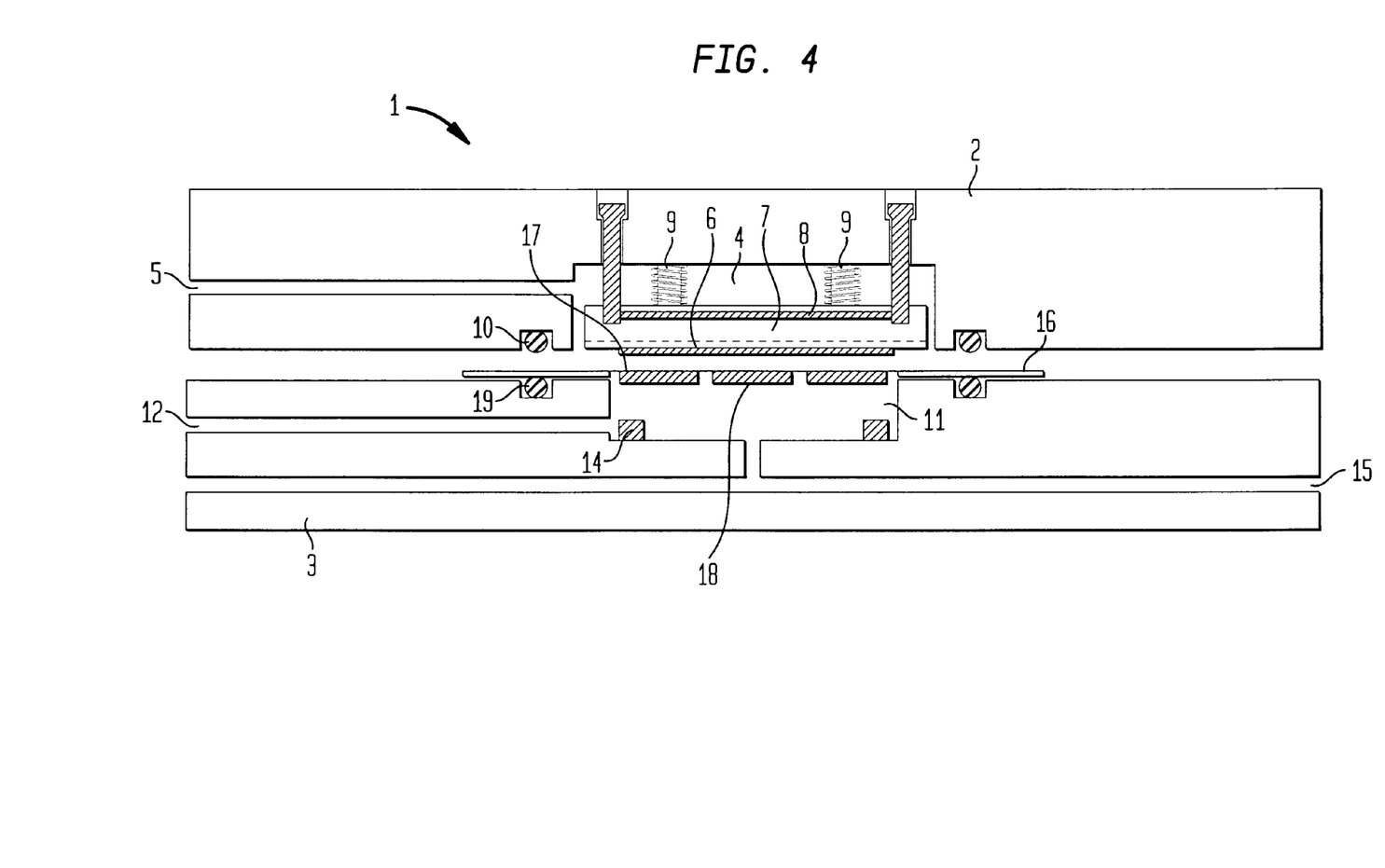
FIG. 4 is a side view of another embodiment of the lamination machine of the present invention.

Top plate 2 has a top o-ring 10 for sealing the top chamber. Bottom plate 3 has a bottom recess 11, a bottom o-ring 19 and a bottom conduit 12 that is connected to bottom recess 11. Bottom conduit 12 may also be connected to a pump (not shown) for regulating the pressure in the bottom chamber that is formed when the top and bottom plates are urged together. As depicted in FIG. 4, the lamination machine of the present invention may also include a bladder 13. Bladder 13 is disposed within bottom recess 11 and which is clamped with bladder clamp 14. Bladder 13 is connected to a bladder conduit 15. Bladder conduit 15 may also be connected to a pump (not shown) for adjusting the gas or fluid pressure in bladder 13. A carrier frame 16, and a dielectric layer 17 having a plurality semiconductor chips 18 connected thereto is also depicted in FIG. 1.

Top plate 2 and bottom plate 3 must be capable of being urged towards each other. Bottom recess 11 must be capable of forming a bottom chamber when bottom plate 3 is urged against top plate 2. Bottom conduit 12 must be capable of communicating with bottom recess 11. Bottom conduit 12 may be connected to a pump that is capable of adjusting the pressure in the bottom chamber. The top and bottom plates are preferably made of metal. The preferred metal is stainless steel.

Platen 6 may be connected to top plate 2 or it may be integral with top plate 2. The lamination machine of the present invention may include means for leveling platen 6. Such means may comprise one or more springs, such as springs 9. As depicted in FIG. 1, platen 6 may be attached to top plate 2 with a plurality of springs 9 such that platen 6 is self-leveling. Platen 6 may be solid, porous or grooved.

If the platen is porous, it can be a sheet of metal having a plurality of holes. Such holes may be aligned with the apertures in the coverlay. In an alternative embodiment, the porous platen can be metal sheet having a high porosity. Metal sheets with high porosity can be made by compressing a plurality of small spheres of such metal into a sheet form. If the platen contains at least one groove, such groove should be on a surface of the platen that confronts the coverlay. The porosity of the porous platen or the groove of the grooved platen allows the gas that is forced from the bottom chamber through the dielectric layer and the coverlay to flow away from the top surface of the coverlay. The platen is preferably made of a metal. The preferred metal is stainless steel.

In order to laminate the coverlay to the microelectronic package, the lamination machine of the present invention should include means for activating the coverlay adhesive. If the coverlay adhesive is activated by heat, such means include means for heating the coverlay adhesive. Such means may include introduction of a heated gas. Such means may include means for heating the platen, such as a heater connected to the top plate, the bottom plate and/or the platen itself. In a preferred embodiment, the heater is comprised of a sheet of silicone rubber which is heated by an electrical circuit. If the coverlay adhesive is activated by ultra-violet light, such means include means for exposing the coverlay adhesive to ultra-violet light. If the coverlay adhesive is activated by another activating agent, such means include means for delivering such activating agent to the coverlay adhesive. In preferred embodiments, the coverlay adhesive is heat activated. Platen 6 may be maintained at a temperature sufficient to activate the adhesive on the coverlay or it may be heated prior to or during the lamination process.

In preferred embodiments, the lamination machine of the present invention has means for forming a vacuum between the top plate and the coverlay. Such means include a pump which is connected to top conduit 5 and which is capable of adjusting the pressure in the top chamber to form a vacuum in such top chamber.

The lamination machine of the present invention may also include one or more O-rings, gaskets or other sealing mechanisms that may be used to seal the top and bottom chambers.

In one method of the present invention, the lamination machine described above is used to laminate a coverlay to a microelectronic package. The microelectronic package comprises a dielectric layer and at least one semiconductor element, such as a semiconductor chip or a semiconductor wafer, connected to such dielectric layer. The dielectric layer is disposed over the bottom plate such that the at least one semiconductor chip is disposed over the bottom recess. A coverlay is placed over the dielectric layer. The top and bottom plates of the lamination machine are urged against one another, with the dielectric layer and the coverlay between such plates, to form a top chamber and a bottom chamber. As the top and bottom plates are urged together, the platen is forced against the coverlay. The platen is heated and the heat activates the adhesive on the coverlay and causes it to begin to flow.

The pressure in the bottom chamber is elevated. The pressure may be elevated by using a pump to force a gas, such as air, through the bottom conduit and into the bottom chamber. In preferred embodiments, the pressure is elevated into the range of 15–250 psi, inclusive, more preferably into the range of 100–150 psi, inclusive. The gas forces the dielectric layer into intimate contact with the coverlay. A vacuum is pulled in the top chamber to help eliminate such voids and bubbles. If the top chamber has a porous or grooved platen, a vacuum may be created in the area between the platen and the top surface of the coverlay by pulling gas away from such area through the platen.

The dielectric layer may have one or more holes or bond windows. Although the present invention is not limited by any theory of operation, it is believed that if the dielectric layer has such holes and/or windows, the pressurized gas may flow from the bottom chamber through such hole or window when such pressurized gas impinges upon the dielectric layer. If the coverlay adhesive has not completely sealed the interface between the coverlay and the dielectric layer, such pressurized gas may then flow through one or more of the apertures in the coverlay and to the platen. If the platen is porous, the gas can then flow out of the lamination machine through the top conduit. If the platen has grooves, then the gas can flow away from the interface between the coverlay and dielectric layer along such grooves. In preferred embodiments, the pressurized gas is air. As the pressurized gas flows through the small apertures, its pressure decreases. This is sometimes referred to as the "Bernolli effect". The difference in pressure between the bottom chamber and the apertures helps force the coverlay and dielectric into intimate contact. The pressurized gas in combination with the heat from the heated platen causes the coverlay to be laminated to the dielectric layer.

Once the dielectric layer and the coverlay are laminated, the assembly can be encapsulated. Once the coverlay has been laminated to the dielectric layer, the at least one semiconductor chip which is connected to the dielectric layer may be encapsulated using a liquid composition that is curable to an encapsulant. Such encapsulants include, but are not limited to, epoxy resins, flexiblized epoxy resins and silicone elastomers. If there is more than one semiconductor chip attached to the dielectric layer, the encapsulated semiconductor chips can be singulated into individual microelectronic packages. The coverlay can be removed before or after singulation or it can be or allowed to remain on the packages. If the coverlay does not have apertures which align with the terminals such apertures can be formed in the coverlay. If the coverlay is a photoimageable soldermask, the apertures can be formed using photolithographic techniques. Solder balls can be attached to the terminals on the dielectric layer. In preferred embodiments the terminals are on the top surface of the dielectric layer.

Figure 4A:
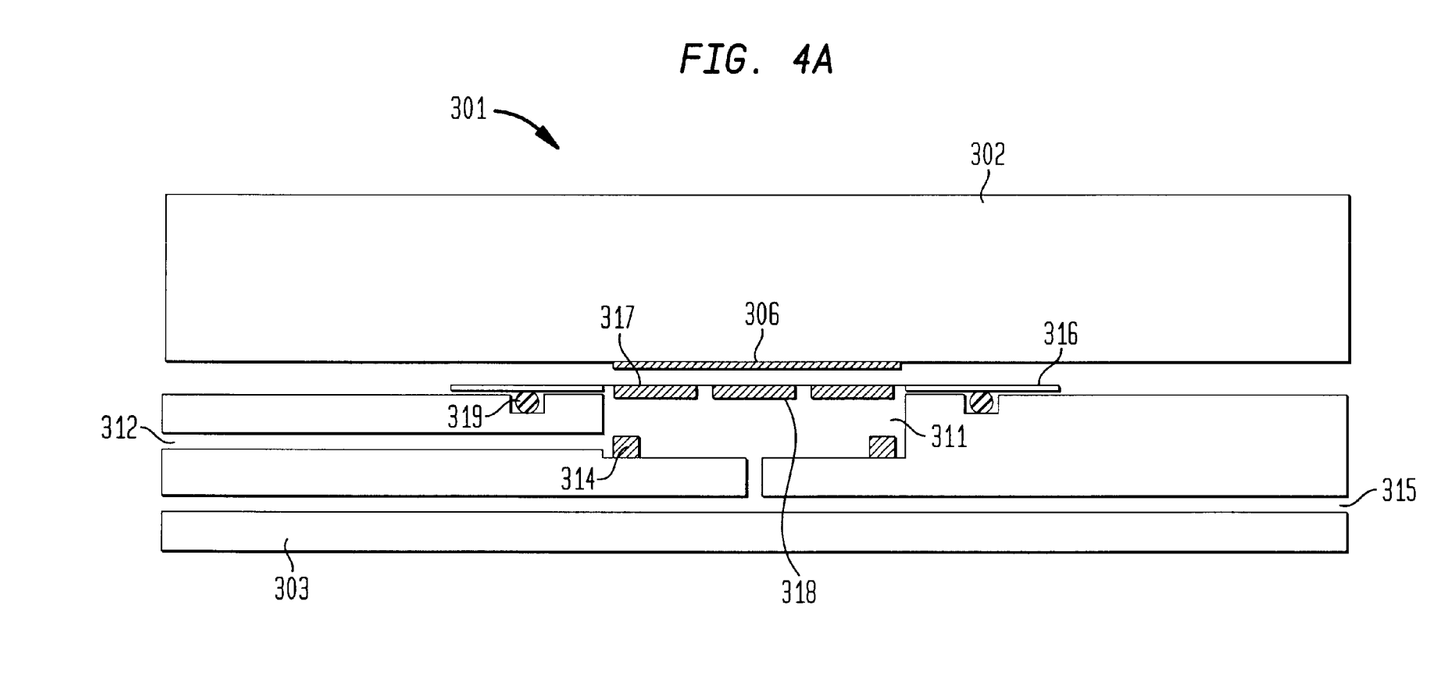
FIG. 4A is a side view of another embodiment of the lamination machine of the present invention.

FIG. 4A is a side view of another embodiment of the lamination machine of the present invention. The lamination machine 301 has a top plate 302 and a bottom plate 303. Lamination machine 301 also has a platen 306, which is connected to top plate 302. Platen 306 may also be connected to heater (not shown).

Figure 1A:
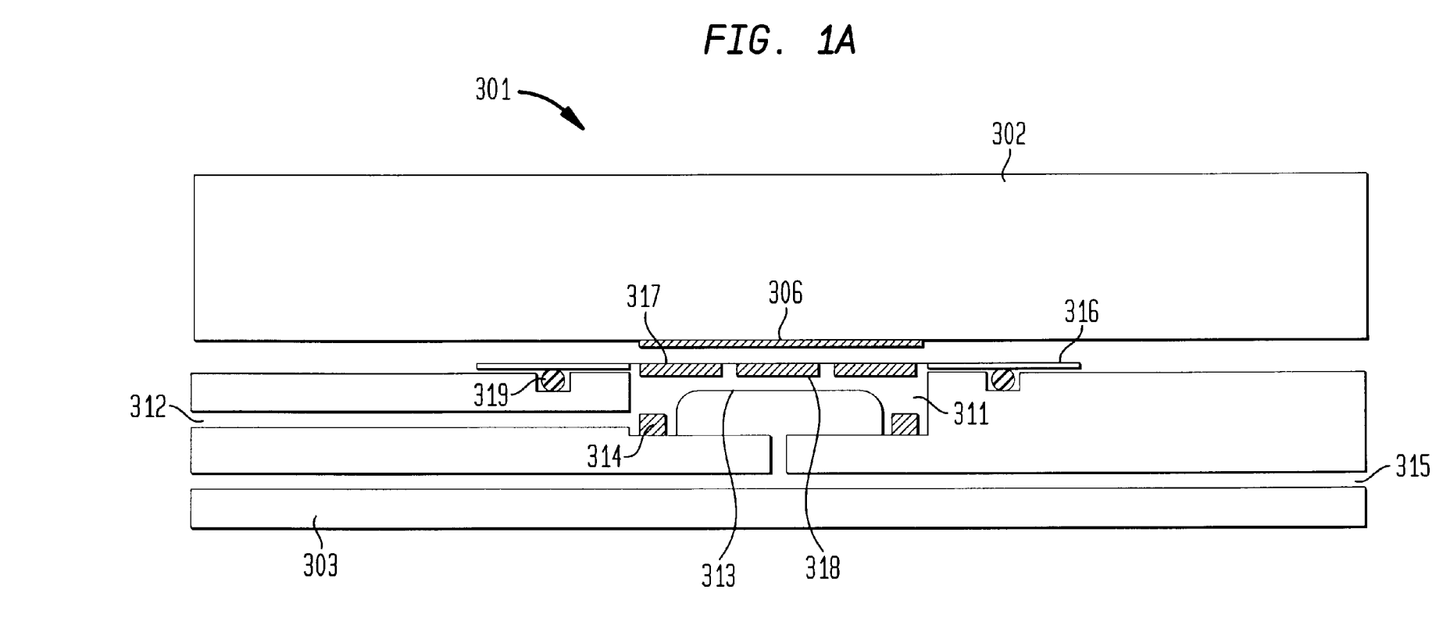
FIG. 1A is a side view of another embodiment of the lamination machine of the present invention.

Bottom plate 303 has a bottom recess 311, a bottom o-ring 319 and a bottom conduit 312 that is connected to bottom recess 311. Bottom conduit 312 may also be connected to a pump (not shown) for regulating the pressure in the bottom chamber that is formed when the top and bottom plates are urged together. The lamination machine of the present embodiment may also include, as depicted in FIG. 1A, a bladder 313 which is disposed within bottom recess 311 and which is clamped with bladder clamp 314. Bladder 313 is connected to a bladder conduit 315. Bladder conduit 315 may also be connected to a pump (not shown) for adjusting the pressure in bladder 313. A carrier frame 316, a dielectric layer 317 with the plurality semiconductor chips 318 connected thereto is also depicted in FIG. 4A.

Top plate 302 and bottom plate 303 must be capable of being urged towards each other. Bottom recess 311 must be capable of forming a bottom chamber when bottom plate 303 is urged against top plate 302. Bottom conduit 312 must be capable of communicating with bottom recess 311. Bottom conduit 312 may be connected to a pump that is capable of adjusting the pressure in the bottom chamber. Platen 306 may be connected to top plate 302 or it may be integral with top plate 302. Lamination machine 301 may include means for leveling plate 306.

In another method of the present invention, the lamination machine described above is used to laminate a coverlay to a microelectronic package. In this method, a dielectric layer having at least one semiconductor chip connected to its bottom surface is disposed over the bottom plate 303 such that the at least one semiconductor chip is disposed over the bottom recess 311. A coverlay is placed over the dielectric layer.

The top and bottom plates of the lamination machine are urged against one another with the dielectric layer and the coverlay between such plates. A bottom chamber is formed. As the top and bottom plates are urged together, the platen is forced against the coverlay. The platen is heated and the heat activates the adhesive on the coverlay and causes it to begin to flow. The pressure in the bottom chamber is elevated. In preferred embodiments, the pressure is elevated into the range of 15–250 psi, inclusive, more preferably into the range of 100–150 psi, inclusive. The gas forces the dielectric layer into intimate contact with the coverlay such that the coverlay adhesive contacts the dielectric layer and the coverlay and dielectric layer are laminated together.

Once the dielectric layer and the coverlay are laminated, the assembly can be encapsulated and solder balls can be attached to the terminals on the top surface of the dielectric layer. If there is more than one semiconductor chip disposed on the bottom surface of the dielectric layer, the semiconductor chips can be singulated to form a plurality of individual encapsulated microelectronic packages. Each microelectronic package can be connected, via the terminals or solder balls connected to the terminals, to an external circuit such as printed circuit board.

Figure 2:
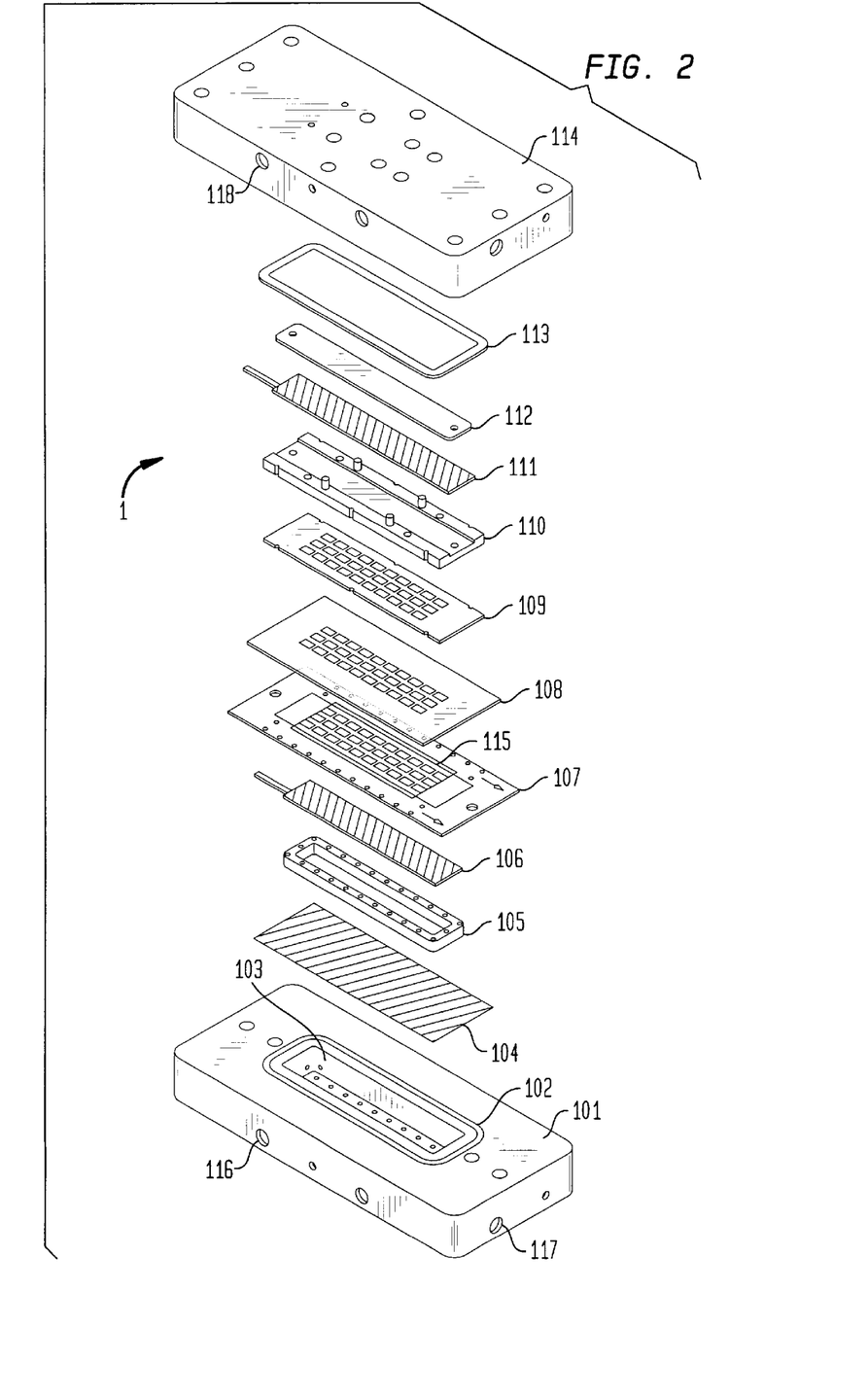
FIG. 2 is an exploded perspective view of the lamination machine of another embodiment of the present invention.

FIG. 2 is an exploded perspective view of the components of another embodiment of the lamination machine of the present invention. The lamination machine depicted in FIG. 2 is not assembled. The components of the lamination machine include a bottom plate 101 with a bottom recess 103, a bottom o-ring 102, a bottom conduit 116, and a bladder conduit 117. Lamination machine 100 also includes a bladder 104 which, when machine 100 is assembled, is disposed within bottom recess 103. In the assembled machine 100, bladder 104 is clamped in place with bladder clamp 105. Bottom heater 106 may be disposed over bladder clamp 105. Bottom heater 106 may be used, either alone or in conjunction with top heater 111 to heat the adhesive on coverlay 108. The lamination machine 100 also includes a top plate 114 having a top recess (not shown), a top o-ring 113, and a top conduit 118. A heater block 110, a top heater 111 and a spacer plate 112 are disposed in the top recess and secured to the top plate 114. A porous platen 109 is connected to heater block 110. When the machine 100 is assembled and connected to vacuum and pressure sources, coverlay 108 can be laminated to the dielectric layer 115 which can be supported on carrier frame 107.

Figure 3:
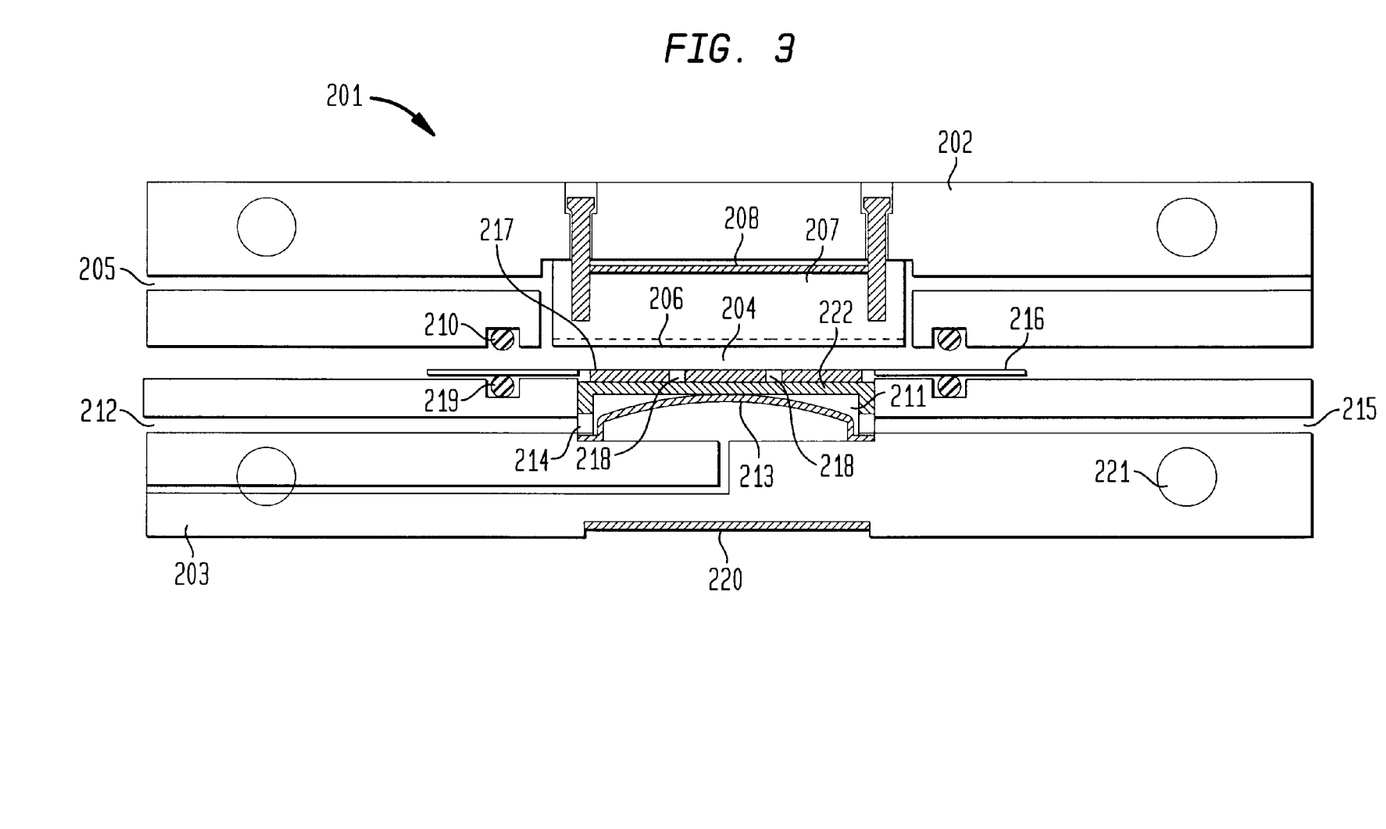
FIG. 3 is a side view of another embodiment of the lamination machine of the present invention.

FIG. 3 is a side view of another lamination machine of the present invention. The lamination machine 201 has a top plate 202 and a bottom plate 203. Top plate 202 has a top recess 204 that is connected to top conduit 205. Top conduit 5 may be connected to a pump (not shown) which is capable of regulating the pressure in the top chamber that is formed when the top and bottom plates are urged against each other. A platen 206 is connected to a heater block 207. Platen 206 is a stencil comprised of a thin sheet of metal having a plurality of holes. A heater 208 is connected to heater block 207. Heater 208 is preferably a sheet of silicone rubber containing a heating element. Heater block 207 is connected to the top plate 202. Top plate 202 has an o-ring 210 for sealing the top chamber. Bottom plate 203 has a bottom recess 211, a bottom o-ring 219 and a bottom conduit 212 that is connected to bottom recess 211. Bottom conduit 212 may also be connected to a pump (not shown) for adjusting the pressure in the bottom chamber that is formed when the top and bottom plates are urged against each other. The lamination machine 201 also includes a bladder 213 which is disposed within bottom recess 211 and which is clamped with bladder clamp 214. Bladder 213 is connected to a bladder conduit 215. Bladder conduit 215 may also be connected to a pump (not shown) for adjusting the pressure in bladder 213.

Lamination machine 201 further comprises additional means for heating the coverlay adhesive. Such means include heater and cartridge heater 221.

Lamination machine 201 further comprises a back die support plate or fixture 222. A carrier frame 216 and a dielectric layer 217 having a plurality semiconductor chips 218 connected thereto is also depicted in FIG. 3. Support fixture 222 is preferably disposed within the bottom recess 211 and may be used to support the back surfaces of the semiconductor chips 218 during a coverlay lamination process. Support fixture 222 is preferably a rigid material having a high thermal conductivity. In preferred embodiments the support fixture 222 is made of copper.

Bladder 213 may be made of any material that is capable of being inflated and deflated with gas pressure. In preferred embodiments, the bladder is comprised of a sheet of elastic material, such as rubber, and the lamination machine further comprises a bladder clamp for securing the bladder in place. A bladder conduit must be connected to the bladder. The conduit may be connected to a pump that is capable of creating a vacuum in the bladder or of pressurizing the bladder. The pressure in the bladder should be adjustable to the extent that the bladder can be made to contact and support the dielectric layer during the initial stages of the lamination process. The bladder supports the dielectric layer so as to minimize the forces exerted on the leads of the microelectronic packages that are connected to the dielectric layer.

Another embodiment of the present invention uses the lamination machine described above to laminate a coverlay to the top surface of a dielectric layer. The dielectric layer has a bottom surface and at least one semiconductor chip connected to such bottom surface. The dielectric layer is placed on the bottom plate such that the at least one semiconductor device is disposed over the bottom recess. A coverlay is placed over the top surface of the dielectric layer. If the coverlay has apertures for exposing the terminals on the dielectric layer, such apertures are aligned with the terminals.

Once the coverlay and dielectric layer are aligned and disposed between the plates, the top and bottom plates are urged against each other. Top and bottom chambers are thereby formed. The pressure in the top chamber, the bottom chamber, and the bladder are adjusted such that a vacuum is formed in each. In preferred embodiments, the pressure in such chambers and bladder are selected so as to avoid deflecting the dielectric layer and stressing the leads of the at least one semiconductor chip. The extent or duration of the vacuum can be adjusted to minimize voids or bubbles in the interface between the dielectric layer and the coverlay. In preferred embodiments, during this initial stage, the vacuum pressures in the chambers and bladder are each in the range of 25–28 in. Hg., inclusive.

The pressure in the bladder is then increased to the extent necessary to support the dielectric layer. The pressure in the bladder may be increased so as to reduce the vacuum in the bladder or it may be increased to the extent that a pressure at or above atmospheric pressure is attained. In preferred embodiments, during this stage of the lamination process, the pressure in the bladder is in the range of 5–10 psi, inclusive. The pressure in the bladder forces the dielectric layer into intimate contact with the coverlay. The pressure in the bladder should be maintained until the coverlay adhesive is activated and the dielectric layer begins to bond to the coverlay. Once the coverlay adhesive is activated, it is no longer necessary to maintain pressure in the bladder. However, if the pressure in the bladder is lower than the pressure in the bottom chamber, steps should be taken to prevent the bladder from being forced into the bladder conduit. Such steps can include a physical barrier on the bladder conduit.

Once the coverlay adhesive has been activated, the pressure in the bottom chamber is increased to insure that the dielectric layer and the coverlay remain in intimate contact. The pressure in the bottom chamber should be increased such that such bottom-chamber-pressure is greater than the bladder-pressure. In preferred embodiments, the bottom-chamber pressure during this stage of the lamination process is in the range of 15–250 psi, inclusive, more preferably in the range of 100–150 psi, inclusive. The pressure and heat cause the dielectric layer and the coverlay to be laminated together.

The dielectric layer with at least one semiconductor chip attached thereto can then be encapsulated. If there are a plurality of semiconductor chips connected to the dielectric layer, the semiconductor chips can be singluated to form a plurality of individual microelectronic packages. Each of the packages can be connected, via the terminals or via solder balls connected to the terminals, to an external circuit such as a printed circuit board.

In another embodiment of the present invention, the lamination machine described in FIG. 3 can be used to laminate a coverlay to a dielectric layer without regulating the pressure in the top chamber. The pressure in the bottom chamber and the bladder are adjusted such that a vacuum is formed in each. The extent and/or duration of the vacuum can be adjusted to minimize voids or bubbles in the interface between the dielectric layer and the coverlay. During this initial stage, the vacuum pressures in the bottom chamber and bladder are preferably each in the range of 25–28 in. Hg., inclusive. The pressure in the bladder is then increased to the extent necessary to support the dielectric layer. During this stage of the lamination process, the pressure in the bladder is preferably in the range of 5–10 psi, inclusive. The pressure in the bladder should be maintained until the coverlay adhesive is activated and the dielectric layer begins to bond to the coverlay. Once the coverlay adhesive is activated, it is no longer necessary to maintain pressure in the bladder. Once the coverlay adhesive has been activated, the pressure in the bottom chamber is increased to force the dielectric layer and the coverlay into intimate contact and to force any air or trapped gas out from between the dielectric layer and the coverlay. The pressure in the bottom chamber should be increased such that such bottomchamber-pressure is greater than the bladder-pressure. In preferred embodiments, the bottom-chamber pressure during this stage of the lamination process is in the range of 15–250 psi, inclusive, more preferably in the range of 100–150 psi, inclusive. The method of this embodiment of the invention can also be practiced using a lamination machine that is similar to the lamination machine described in FIG. 3 but is without a top recess, a top conduit or a top chamber.

In preferred embodiments of the lamination machines of the present invention, the top surface of the bottom plate has at least one fiducial marker, more preferably at least two fiducial markers such that the dielectric layer and the coverlay can be precisely aligned. The top and bottom plates may both be attached to a frame. The plates must be slideable relative to each other so that in a first orientation the plates are separated and in a second orientation, the plates are juxtaposed.

The coverlay typically has a layer of adhesive disposed on its bottom surface. The adhesive is preferably non-tacky at room temperature or only slightly tacky at room temperature, is activated upon exposure to an elevated temperature, begins to flow upon heating and is capable of bonding the coverlay to the dielectric layer. The coverlay is preferably made of a thin sheet of a dielectric material, such as an acrylic, epoxy or a polyimide. The coverlay can also be made of a thin sheet of a photoimageable material such as a solder mask. The coverlay may be a temporary coverlay or a permanent coverlay. Although the coverlay may be aperture-free, in preferred embodiments the coverlay has a plurality of apertures that are aligned with the electrically conductive terminals on the top surface of the dielectric layer. Preferably, when the coverlay is placed over the top surface of the dielectric layer, each aperture is aligned with and disposed over one of the terminals. If the coverlay is a sheet of a photoimageable material, the terminals on the dielectric layer may be exposed by forming apertures on the coverlay using photolithographic techniques. The apertures may be formed before, during or after the encapsulant is cured.

In preferred embodiments the dielectric layer is comprised of a circuitized sheet of polyimide and has a plurality of semiconductor chips attached to it. The circuitized sheet of polyimide has a plurality of electrically conductive terminals. Each of the semiconductor chips has a plurality of electrically conductive contacts. The terminals and the contacts are connected via a plurality of leads.

The dielectric layer with the at least one semiconductor chip connected thereto, may be placed on a carrier frame prior to lamination in order to ease handling during the lamination process. The use of a carrier frame may also serve to align the coverlay and dielectric layer. The coverlay, dielectric layer, and carrier frame are placed between the top and bottom plates of the lamination machine. The top and bottom plates are then urged against each other. The dielectric layer may be connected to a carrier frame. In an alternative embodiment both the dielectric layer and the coverlay may be connected to the carrier frame before being placed between the top and bottom plates of the lamination machine.

As these and other variation and combinations of the features discussed above can be utilized without departing from the present invention as defined in the claims, the foregoing description of the preferred embodiments should be taken as illustrating, rather than limiting, the invention as claimed.

What is claimed is:

1. A method of laminating a coverlay to a microelectronic package, said method comprising:
   A. providing a lamination machine having
      i. a top plate,
      ii. a bottom plate having a bottom recess,
      iii. means for bringing the top plate and bottom plate towards one and another and thereby forming a bottom chamber,
      iv. means for regulating pressure in the bottom chamber, and
      v. means for activating a coverlay adhesive;
   B. disposing a microelectronic packaging on the bottom plate, wherein
      1) the microelectronic package comprises a dielectric layer having a top surface and a bottom surface; and at least one semiconductor element connected to the bottom surface of the dielectric layer;
      2) the at least one semiconductor element has a face surface facing the bottom surface of the dielectric layer and a back surface opposite the face surface; and
      3) the at least one semiconductor element is disposed within the bottom recess;
   C. disposing a coverlay beneath the top plate and over the top surface of the dielectric layer; wherein the coverlay includes an adhesive disposed on a surface facing the top surface of the dielectric layer;
   D. bringing the top and bottom plates toward one another to form a bottom chamber;
   E. activating the adhesive on the surface of the coverlay; and
   F. increasing the pressure in the bottom chamber.

2. The method of claim 1 further comprising decreasing the pressure in the bottom chamber before increasing the pressure in the bottom chamber.

3. The method of claim 2, wherein the step of decreasing the pressure in the bottom chamber occurs before the step of activating the adhesive.

4. A lamination machine having:
   A. a top plate;
   B. a bottom plate having a bottom recess;
   C. means for bringing the top plate and the bottom plate towards one another and thereby forming a bottom chamber;
   D. means for regulating pressure in the bottom chamber; and
   E. means for activating a coverlay adhesive,
   F. wherein the top plate has a top recess and the means for bringing the top plate and the bottom plate towards one another includes means for forming a top chamber and the lamination machine further includes a platen connected to the top plate.

5. The lamination machine of claim 4, wherein the platen is adjustable connected to the top plate and wherein the machine further comprises means for leveling the platen.

6. The lamination machine of claim 5, wherein the means for regulating the pressure in the bottom chamber includes a first pump in communication with the bottom chamber.

7. The lamination machine of claim 6, further including means for regulating the pressure in the top chamber.

8. The lamination machine of claim 7, wherein the means for regulating the pressure in the top chamber include a third pump in communication with the top chamber.

9. The lamination machine of claim 4, wherein the platen has at least one groove.

10. The lamination machine of claim 4, wherein the platen is porous.

11. The lamination machine of claim 4, wherein the platen is a sheet of metal having a plurality of holes.

12. The lamination machine of claim 4, wherein the plate is a sheet of metal having a high porosity.

13. The lamination machine of claim 4, further comprising means for sealing the top and bottom chambers.

14. The lamination machine of claim 4, wherein the means for activating a coverlay adhesive includes means for heating the coverlay adhesive.

15. The lamination machine of claim 14, wherein the means for heating includes a heater comprising an electrical circuit disposed within a sheet of silicone rubber.

16. A method of laminating a coverlay to a microelectronic package, said method comprising:
   A. providing a lamination machine in accordance with claim 4;
   B. disposing a microelectronic packaging on the bottom plate, wherein
      1) the microelectronic package comprises
         a dielectric layer having a top surface and a bottom surface; and
         at least one semiconductor element connected to the bottom surface of the dielectric layer;
      2) the at least one semiconductor element has a face surface facing the bottom surface of the dielectric layer and a back surface opposite the face surface; and
      3) the at least one semiconductor element is disposed within the bottom recess;
   C. disposing a coverlay beneath the top plate and over the top surface of the dielectric layer; wherein the coverlay includes an adhesive disposed on a surface facing the top surface of the dielectric layer;
   D. bringing the top and bottom plates toward one another to form a top chamber and a bottom chamber;

E. decreasing the pressure in the top chamber;

F. activating the adhesive on the surface of the coverlay; and

G. increasing the pressure in the bottom chamber.

17. The method of claim 16, wherein the step of decreasing the pressure in the top chamber occurs after the steps of activating the adhesive and increasing the pressure in the bottom chamber.

18. The method of claim 16, further comprising decreasing the pressure in the bottom chamber before activating the adhesive before the step of activating the adhesive.

19. the method of claim 18, wherein the steps of decreasing the pressure in the top and bottom chambers occurs simultaneously.

20. A lamination machine having:

A. a top plate;

B. a bottom plate having a bottom recess;

C. means for bringing the top plate and the bottom plate towards one another and thereby forming a bottom chamber;

D. means for regulating pressure in the bottom chamber;

E. means for activating a coverlay adhesive;

F. a bladder disposed in the bottom recess; and

G. means for regulating the pressure in the bladder.

21. The lamination machine of claim 20, wherein the means for regulating the pressure in the bottom chamber includes a first pump in communication with the bottom chamber.

22. The lamination machine of claim 21, wherein the means for regulating the pressure in the bladder includes a second pump in communication with the bladder.

23. The lamination machine of claim 22, further comprising means for sealing the bottom chamber.

24. The lamination machine of claim 23, wherein the means for activating a coverlay adhesive includes means for heating the coverlay adhesive.

25. The lamination machine of claim 24, wherein the means for heating a heater comprising an electrical circuit disposed within a sheet of silicone rubber.

26. A method of laminating a coverlay to a microelectronic package, said method comprising:

A. providing a lamination machine in accordance with claim 20;

B. disposing a microelectronic packaging on the bottom plate, wherein
  1) the microelectronic package comprises
     a dielectric layer having a top surface and a bottom surface; and
     at least one semiconductor element connected to the bottom surface of the dielectric layer;
  2) the at least one semiconductor element has a face surface facing the bottom surface of the dielectric layer and a back surface opposite the face surface; and
  3) the at least one semiconductor element is disposed within the bottom recess;

C. disposing a coverlay beneath the top plate and over the top surface of the dielectric layer; wherein the coverlay includes an adhesive disposed on a surface facing the top surface of the dielectric layer;

D. bringing the top and bottom plates toward one another to form a top chamber and a bottom chamber;

E. decreasing the pressure in the bladder;

F. decreasing pressure in the bottom chamber;

G. activating the adhesive on the surface of the coverlay; and

H. increasing the pressure in the bladder.

27. The method of claim 26, wherein the step of decreasing the pressure in the bladder occurs after the step of decreasing the pressure in the bottom chamber.

28. The method of claim 26, wherein the steps of decreasing the pressure in the bladder and the bottom chamber occur simultaneously.

29. The lamination machine of claim 20, wherein the top plate has a top recess and the means for bringing the top plate and the bottom plate towards one another includes means for forming a top chamber and the lamination machine further includes a platen connected to the top plate.

30. The lamination machine of claim 29, wherein the platen is adjustable connected to the top plate and wherein the machine further comprises means for leveling the platen.

31. The lamination machine of claim 30, wherein the leveling means includes a spring connecting the platen to the top plate.

32. The lamination machine of claim 29, wherein the means for regulating the pressure in the bottom chamber includes a first pump in communication with the bottom chamber.

33. The lamination machine of claim 32, wherein the means for regulating the pressure in the bladder includes a second pump in communication with the bladder.

34. The lamination machine of claim 33, further including means for regulating the pressure in the top chamber.

35. The lamination machine of claim 34, wherein the means for regulating the pressure in the top chamber include a third pump in communication with the top chamber.

36. The lamination machine of claim 29, wherein the platen has at least one groove.

37. The lamination machine of claim 29, wherein the platen is porous.

38. The lamination machine of claim 37, wherein the platen is a sheet of metal having a plurality of holes.

39. The lamination machine of claim 29, wherein the plate is a sheet of metal having a high porosity.

40. The lamination machine of claim 39, further comprising means for sealing the top and bottom chambers.

41. The lamination machine of claim 29, wherein the means for activating a coverlay adhesive includes means for heating the coverlay adhesive.

42. The lamination machine of claim 21, wherein the means for heating includes at least one heater.

43. The lamination machine of claim 42, wherein the heater is an electrical circuit disposed within a sheet of silicone rubber.

44. The lamination machine of claim 29, wherein the means for activating a coverlay adhesive include means for exposing a coverlay adhesive to ultraviolet energy.

45. The lamination machine of claim 29, further comprising a support fixture disposed within the bottom recess for supporting a back surface of a semiconductor chip during a coverlay lamination process.

46. A method of laminating a coverlay to a microelectronic package, said method comprising:

A. providing a lamination machine in accordance with claim 29;

B. disposing a microelectronic packaging on the bottom plate, wherein
  1) the microelectronic package comprises
     a dielectric layer having a top surface and a bottom surface; and
     at least one semiconductor element connected to the bottom surface of the dielectric layer;

2) the at least one semiconductor element has a face surface facing the bottom surface of the dielectric layer and a back surface opposite the face surface; and 3) the at least one semiconductor element is disposed within the bottom recess;

C. disposing a coverlay beneath the top plate and over the top surface of the dielectric layer; wherein the coverlay includes an adhesive disposed on a surface facing the top surface of the dielectric layer;

D. bringing the top and bottom plates toward one another to form a top chamber and a bottom chamber;

E. decreasing the pressure in the bladder;

F. decreasing the pressure in the top chamber;

G. activating the adhesive on the surface of the coverlay; and

H. increasing the pressure in the bladder.

47. The method of claim 46, further comprising decreasing the pressure in the bottom chamber before activating the adhesive.

48. The method of claim 47, wherein the steps of decreasing the pressure in the top chamber, the bottom chamber and the bladder occur simultaneously.

49. A method of laminating a coverlay to a microelectronic package, said method comprising:

A. providing a lamination machine in accordance with claim 35;

B. disposing a microelectronic packaging on the bottom plate, wherein
   1) the microelectronic package comprises
      a dielectric layer having a top surface and a bottom surface; and
      at least one semiconductor element connected to the bottom surface of the dielectric layer;
   2) the at least one semiconductor element has a face surface facing the bottom surface of the dielectric layer and a back surface opposite the face surface; and
   3) the at least one semiconductor element is disposed within the bottom recess;

C. disposing a coverlay beneath the top plate and over the top surface of the dielectric layer; wherein the coverlay includes an adhesive disposed on a surface facing the top surface of the dielectric layer;

D. bringing the top and bottom plates toward one another to form a top chamber and a bottom chamber and to bring the platen into contact with the coverlay;

E. decreasing the pressure in the top chamber, the bottom chamber and the bladder;

F. increasing the pressure in the bladder until the bladder supports the dielectric layer and forces the dielectric layer into intimate contact with the coverlay;

G. activating the adhesive on the surface of the coverlay to bond the coverlay to the dielectric layer;

H. reducing the pressure in the bladder when the coverlay begins to bond to the dielectric layer; and I. increasing the pressure in the bottom chamber to maintain intimate contact between the coverlay and the dielectric layer, when the coverlay begins to bond to the dielectric layer.

50. A method of laminating a coverlay to a microelectronic package, said method comprising:

A. providing a lamination machine in accordance with claim 35;

B. disposing a microelectronic packaging on the bottom plate, wherein
   1) the microelectronic package comprises
      a dielectric layer having a top surface and a bottom surface; and
      at least one semiconductor element connected to the bottom surface of the dielectric layer;
   2) the at least one semiconductor element has a face surface facing the bottom surface of the dielectric layer and a back surface opposite the face surface; and
   3) the at least one semiconductor element is disposed within the bottom recess;

C. disposing a coverlay beneath the top plate and over the top surface of the dielectric layer; wherein the coverlay includes an adhesive disposed on a surface facing the top surface of the dielectric layer;

D. bringing the top and bottom plates toward one another to form a top chamber and a bottom chamber and to bring the platen into contact with the coverlay;

E. decreasing the pressure in the bottom chamber and the bladder;

F. increasing the pressure in the bladder until the bladder support the dielectric layer and forces the dielectric layer into intimate contact with the coverlay;

G. activating the adhesive on the surface of the coverlay to bond the coverlay to the dielectric layer;

H. reducing the pressure in the bladder when the coverlay begins to bond to the dielectric layer; and I. increasing the pressure in the bottom chamber when the coverlay begins to bond to the dielectric layer to maintain intimate contact between the coverlay and the dielectric layer.

* * * * *

UNITED STATES PATENT AND TRADEMARK OFFICE
CERTIFICATE OF CORRECTION

PATENT NO.     : 6,197,665 B1
DATED          : March 6, 2001
INVENTOR(S)    : DiStefano et al.

It is certified that error appears in the above-identified patent and that said Letters Patent is hereby corrected as shown below:

Title page,
Item [57], "bubble and/or" should read -- bubbles and/or --

Column 2,
Line 48, "terms description" should read -- terms of description --

Column 5,
Line 19, "to heater" should read -- to a heater --

Column 6,
Line 8, "as printed" should read -- as a printed --
Line 60, "plurality semiconductor" should read -- plurality of semiconductor --

Column 8,
Line 32, "bottomchamber" should read -- bottom-chamber --

Column 9,
Line 12, "layer" should read -- layer, --
Line 38, "one and another" should read -- one another --

Column 10,
Line 19, "adjustable" should read -- adjustably --

Column 11,
Line 10, delete "before activating the adhesive"
Line 40, "comprising" should read -- comprises --

UNITED STATES PATENT AND TRADEMARK OFFICE
CERTIFICATE OF CORRECTION

PATENT NO. : 6,197,665 B1
DATED : March 6, 2001
INVENTOR(S) : DiStefano et al.

It is certified that error appears in the above-identified patent and that said Letters Patent is hereby corrected as shown below:

Column 12,
Line 15, "adjustable" should read -- adjustably --
Line 45, "21" should read -- 41 --

Column 14,
Line 40, "support" should read -- supports --

Signed and Sealed this

Sixth Day of November, 2001

*Attest:*

NICHOLAS P. GODICI
*Attesting Officer*    Acting Director of the United States Patent and Trademark Office